United States Patent
Chen et al.

(10) Patent No.: US 12,293,944 B2
(45) Date of Patent: May 6, 2025

(54) SEMICONDUCTOR DEVICE WITH SELF-ALIGNED VIAS

(71) Applicant: Taiwan Semiconductor Manufacturing Co., Ltd., Hsinchu (TW)

(72) Inventors: Chien-Han Chen, Nantou (TW); Chien-Chih Chiu, Xinying (TW); Ming-Chung Liang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 249 days.

(21) Appl. No.: 17/750,887

(22) Filed: May 23, 2022

(65) Prior Publication Data

US 2022/0285216 A1 Sep. 8, 2022

Related U.S. Application Data

(63) Continuation of application No. 16/275,109, filed on Feb. 13, 2019, now Pat. No. 11,502,001.
(Continued)

(51) Int. Cl.
*H01L 21/768* (2006.01)
*H01L 21/02* (2006.01)
(Continued)

(52) U.S. Cl.
CPC .. *H01L 21/76897* (2013.01); *H01L 21/02164* (2013.01); *H01L 21/02271* (2013.01);
(Continued)

(58) Field of Classification Search
CPC ................................................ H01L 21/76897
See application file for complete search history.

(56) References Cited

U.S. PATENT DOCUMENTS

| 6,090,696 A | 7/2000 | Jang et al. |
| 9,911,691 B2 | 3/2018 | Zheng et al. |

(Continued)

FOREIGN PATENT DOCUMENTS

| CN | 105742235 A | 7/2016 |
| CN | 108122831 A | 6/2018 |

(Continued)

OTHER PUBLICATIONS

Gayle Murdoch et al., "Feasibility Study of Fully Self Aligned Vias for 5nm Node BEOL" Authorized licensed use limited to: Korean Intellectual Property Office (KIPO). Downloaded on Jul. 27, 2020 at 07:16:51 UTC from IEEE Xplore., 4 pages.

*Primary Examiner* — Peter Bradford
(74) *Attorney, Agent, or Firm* — Slater Matsil, LLP

(57) ABSTRACT

A method of forming a semiconductor device includes forming a conductive line over a substrate; forming an etch stop layer (ESL) over the conductive line, the ESL extending continuously along an upper surface of the conductive line and along an upper surface of a first dielectric layer adjacent to the conductive line, where a first lower surface of the ESL contacts the upper surface of the conductive line, and a second lower surface of the ESL contacts the upper surface of the first dielectric layer, the first lower surface being closer to the substrate than the second lower surface; forming a second dielectric layer over the ESL; forming an opening in the second dielectric layer, the opening exposing a first portion of the ESL; removing the first portion of the ESL to expose the conductive line; and filling the opening with an electrically conductive material to form a via.

20 Claims, 11 Drawing Sheets

Related U.S. Application Data

(60) Provisional application No. 62/753,496, filed on Oct. 31, 2018.

(51) Int. Cl.
*H01L 23/522* (2006.01)
*H01L 21/311* (2006.01)
*H01L 21/3213* (2006.01)
*H01L 23/532* (2006.01)

(52) U.S. Cl.
CPC .. *H01L 21/76807* (2013.01); *H01L 21/76831* (2013.01); *H01L 21/76832* (2013.01); *H01L 21/76865* (2013.01); *H01L 21/76883* (2013.01); *H01L 23/5226* (2013.01); *H01L 21/02211* (2013.01); *H01L 21/31122* (2013.01); *H01L 21/32134* (2013.01); *H01L 23/53238* (2013.01)

(56) References Cited

U.S. PATENT DOCUMENTS

| | | | |
|---|---|---|---|
| 10,032,643 | B2 | 7/2018 | Chawla et al. |
| 10,685,873 | B2 | 6/2020 | Tung et al. |
| 11,037,872 | B2 | 6/2021 | Han et al. |
| 11,081,397 | B2 | 8/2021 | Hsu et al. |
| 2004/0087183 | A1 | 5/2004 | Goodner et al. |
| 2006/0022328 | A1 | 2/2006 | Lee |
| 2010/0314777 | A1* | 12/2010 | Oda .................. H01L 23/53295 |
| | | | 257/E21.585 |
| 2011/0220917 | A1* | 9/2011 | Hayashi ................ H01L 21/045 |
| | | | 257/E21.24 |
| 2014/0117558 | A1 | 5/2014 | Boyanov |
| 2014/0264895 | A1 | 9/2014 | Sung et al. |
| 2015/0097293 | A1 | 4/2015 | Yao et al. |
| 2016/0240428 | A1 | 8/2016 | Tung et al. |
| 2017/0092533 | A1 | 3/2017 | Chakraborty et al. |
| 2017/0092580 | A1* | 3/2017 | Huang ................ H01L 21/7684 |
| 2017/0178954 | A1* | 6/2017 | Wu ..................... H01L 23/5226 |
| 2017/0236929 | A1* | 8/2017 | Green ............. H01L 21/31116 |
| | | | 257/194 |
| 2017/0330761 | A1 | 11/2017 | Chawla et al. |
| 2018/0151445 | A1* | 5/2018 | Hsu .................... H01L 21/76877 |
| 2018/0308793 | A1* | 10/2018 | Lin ..................... H01L 21/0234 |
| 2019/0088541 | A1 | 3/2019 | Licausi et al. |
| 2019/0165258 | A1 | 5/2019 | Peng et al. |
| 2019/0385906 | A1 | 12/2019 | Aizawa et al. |
| 2020/0051859 | A1* | 2/2020 | Sun .................... H01L 21/32056 |
| 2020/0098620 | A1* | 3/2020 | Lee ................... H01L 21/76843 |
| 2020/0105664 | A1* | 4/2020 | Han .................... H01L 23/5226 |
| 2020/0135560 | A1* | 4/2020 | Clevenger ......... H01L 21/76897 |

FOREIGN PATENT DOCUMENTS

| | | | |
|---|---|---|---|
| JP | 2010260062 A | * | 11/2010 |
| KR | 20170095827 A | | 8/2017 |
| TW | 567581 B | | 12/2003 |
| TW | 201801278 A | | 1/2018 |
| TW | 202015205 A | | 4/2020 |
| WO | 2017165206 A1 | | 9/2017 |

\* cited by examiner

SEMICONDUCTOR DEVICE WITH SELF-ALIGNED VIAS

PRIORITY CLAIM AND CROSS-REFERENCE

This application is a continuation of U.S. patent application Ser. No. 16/275,109, filed Feb. 13, 2019, entitled "Semiconductor Device with Self-Aligned Vias", which claims priority to U.S. Provisional Patent Application No. 62/753,496, filed Oct. 31, 2018, entitled "Semiconductor Device with Self-Aligned Vias," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the feature size of semiconductor devices continues to shrink and the integration density continues to increase, more challenges are faced in semiconductor manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
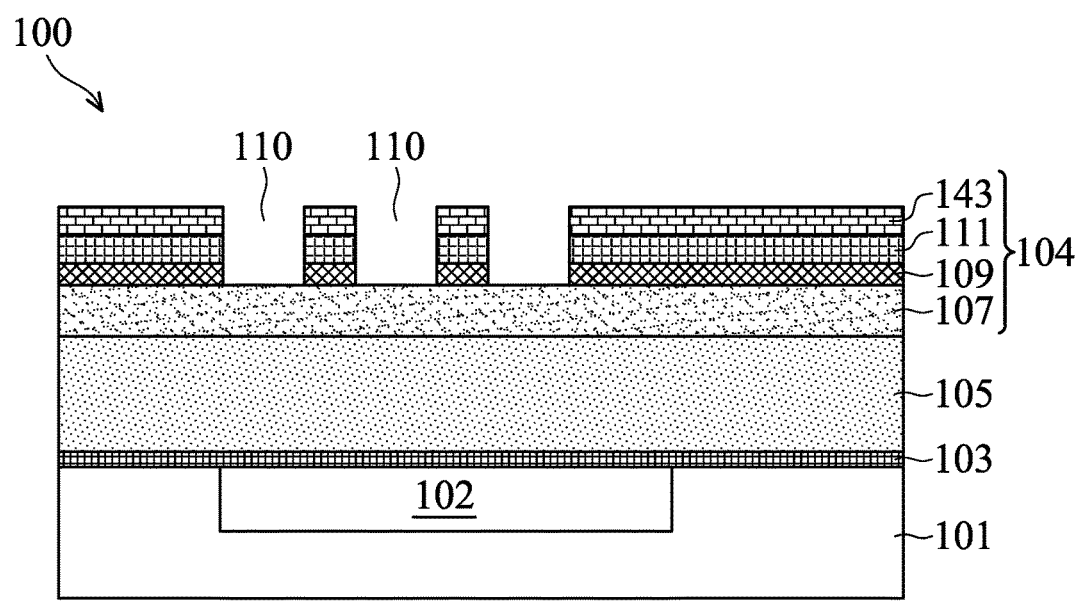
FIGS. 1-9 are cross-sectional views of a semiconductor device at various stages of manufacturing, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Unless otherwise specified, like reference numerals refer to like elements that are formed by a same or similar material using a same or similar method.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments disclosed herein are related to forming self-aligned vias (SAVs) in a semiconductor device. In some embodiments, to form an SAV that is electrically coupled to an underlying conductive line, a non-planar etch stop layer (ESL) is formed over the conductive line and over a first dielectric layer in which the conductive line is formed, where the ESL has a first lower surface and a second lower surface that is spaced apart from (e.g., having an offset with) the first lower surface. The first lower surface contacts and extends along an upper surface of the conductive line, and the second lower surface extends along an upper surface of the first dielectric layer, where the second lower surface is further from the conductive line than the first lower surface. The ESL may have a plurality of sublayers (e.g., conformal sublayers) formed successively over the conductive line and over the first dielectric layer. A second dielectric layer is then formed over the ESL, and an opening is formed in the second dielectric layer to expose a first portion of the ESL. The first portion of the ESL is then removed to expose the underlying conductive line, and a via is formed in the opening by filling the opening with an electrically conductive material(s).

Various methods to form the ESL that has the first lower surface and the second lower surface are disclosed. In an embodiment, the conductive line is formed in the first dielectric layer over a substrate, and then, the conductive line is recessed (e.g., etched) such that the upper surface of the conductive line is closer to the substrate than the upper surface of the first dielectric layer. The ESL is then formed conformally over the conductive line and over the first dielectric layer. In another embodiment, the conductive line is formed in the first dielectric layer over a substrate such that the upper surface of the conductive line is level with the upper surface of the first dielectric layer. Next, a third dielectric layer is selectively formed over the upper surface of the first dielectric layer while exposing the conductive line, and the ESL is formed conformally over the conductive line and over the third dielectric layer. Thereafter, the second dielectric layer is formed over the ESL.

FIGS. 1-9 are cross-sectional views of a semiconductor device 100 at various stages of manufacturing, in accordance with an embodiment. As illustrated in FIG. 1, the semiconductor device 100 includes a substrate 101 and a device region 102 in the substrate 101. The semiconductor device 100 further includes an etch stop layer (ESL) 103, a dielectric layer 105, and a film stack 104 over the dielectric layer 105, which film stack 104 further includes a plurality of dielectric layers, such as dielectric layers 107, 109, 111, and 143.

The substrate 101 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in the device region 102 of the substrate 101. The device region 102 may further include conductive features such as contacts (also referred to as contact plugs), e.g., gate contacts and source/drain contacts, that are electrically coupled to the gates and the source/drain regions, respectively, of underlying transistors.

The ESL 103 is used to protect the underlying structures and provide a control point for a subsequent etching process through, e.g., the dielectric layer 105, and may be formed of a suitable material, such as aluminum oxide (e.g., $AlO_x$), by a suitable method such as chemical vapor deposition (CVD), physical vapor deposition (PVD), or the like. The dielectric layer 105 may be made of one or more suitable materials such as silicon oxide, silicon nitride, low-k dielectrics such as carbon doped oxides, extremely low-k dielectrics such as porous carbon doped silicon dioxide, combinations of these, or the like. The dielectric layer 105 may be formed through a process such as chemical vapor deposition (CVD), although any suitable process may be utilized.

In the example of FIG. 1, the film stack 104 includes the dielectric layers 107, 109, 111, and 143 formed successively over the dielectric layer 105. Each of the dielectric layers 107, 109, 111 and 143 may be formed of a suitable dielectric material such as silicon oxide, silicon nitride, silicon carbonitride, silicon carbide, titanium nitride, tetraethyl orthosilicate, or the like. In some embodiments, the dielectric layer 107 comprises an oxide (e.g., silicon oxide) formed of tetraethyl orthosilicate (TEOS) (also referred to as TEOS-formed oxide), the dielectric layer 109 is formed of silicon carbide (e.g., SiC), the dielectric layer 111 is formed of titanium nitride (e.g., TiN), and the dielectric layer 143 is formed of TEOS-formed oxide. Each layer of the film stack 104 may be formed of a suitable formation method, such as PVD, CVD, spin-coating, combinations thereof, or the like. The number of sublayers and the materials of the sublayers in the film stack 104 illustrated in FIG. 1 are illustrative and non-limiting, and may be determined by factors such as the photolithography and etching processes performed subsequently. Other numbers of sublayers and other materials for the sublayers of the film stack 104 are also possible and are fully intended to be included in the scope of the present disclosure.

After the film stack 104 is formed, openings 110 are formed in the film stack 104 using, e.g., photolithography and etching techniques. The openings 110 extend through the film stack 104 and expose the dielectric layer 107. The locations of the openings 110 correspond to locations of conductive lines 115 (see, e.g., FIGS. 3 and 4) formed subsequently. After the openings 110 are formed, the dielectric layer 143 (e.g., TEOS-formed oxide) is removed by a suitable process, such as etching, in some embodiments.

Figure 2:
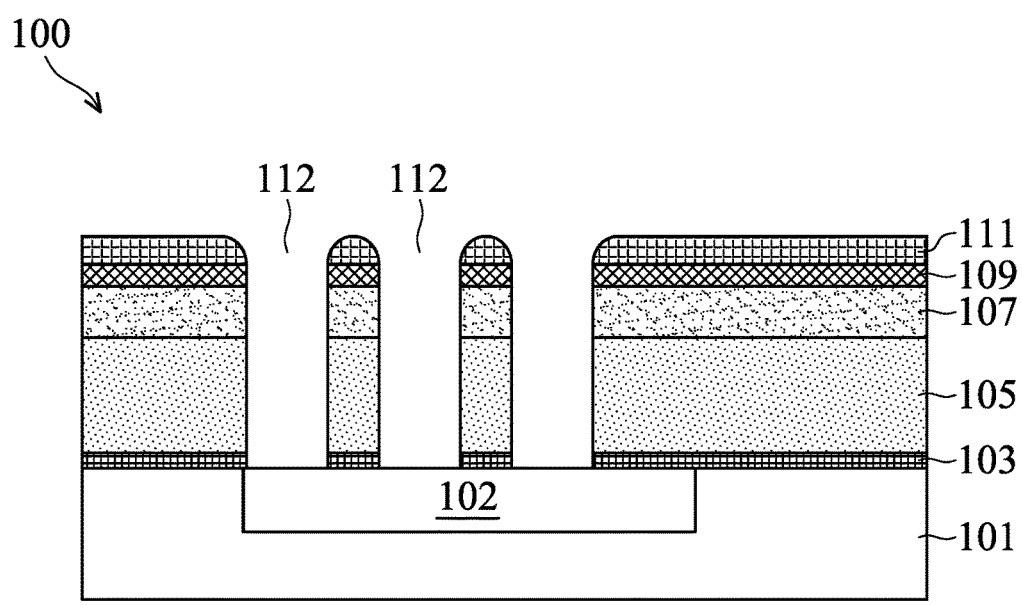

Next, in FIG. 2, the openings 110 are extended to form openings 112. The openings 112 extend through the dielectric layer 107, the dielectric layer 105, the ESL 103, and expose the conductive features (e.g., gate contacts and/or source/drain contacts) in the device region 102. In an embodiment, to form the openings 112, a dry etch process, such as a plasma process, is performed first to extend the opening 110 through the dielectric layers 107 and 105 such that the ESL 103 is exposed. Next, a wet etch process is performed to etch through the ESL 103 and to expose the underlying conductive features in the device region 102. The dry etch process may use an etching gas comprising octafluorocyclobutane (e.g., $C_4F_8$), tetrafluoromethane (e.g., $CF_4$), or both. The wet etch may use a chemical such as ammonium hydroxide (e.g., $NH_4OH$).

Figure 3:
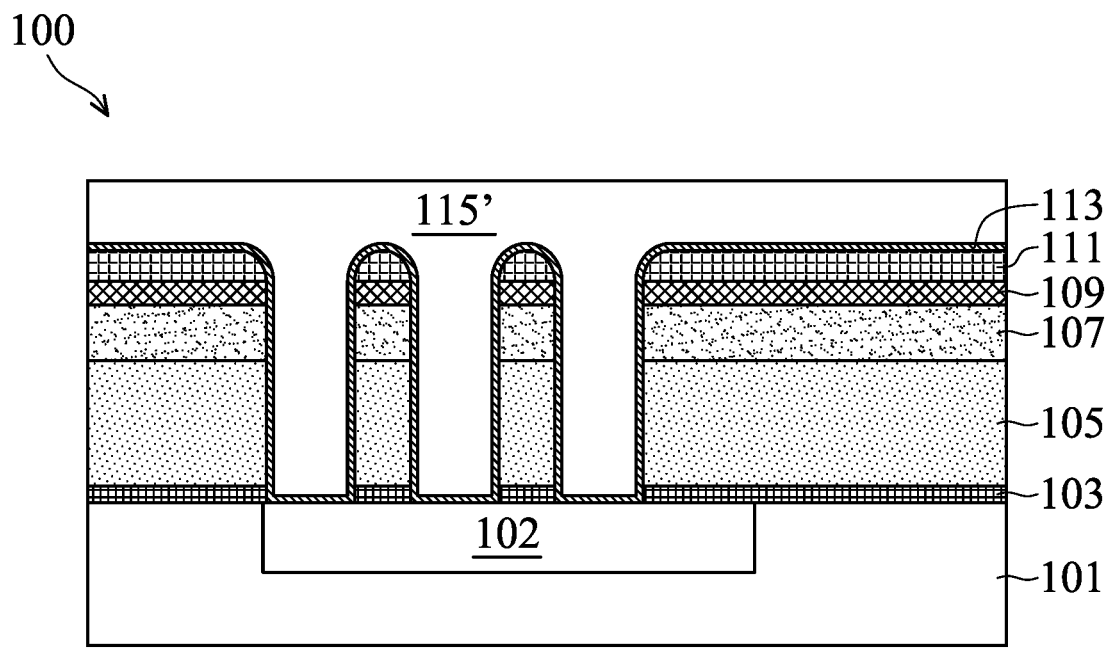

Next, in FIG. 3, a barrier layer 113 is formed (e.g., conformally) over the semiconductor device 100. As illustrated in FIG. 3, the barrier layer 113 lines the sidewalls and the bottoms of openings 112, and extends along the upper surface of the dielectric layer 111. The barrier layer 113 may comprise an electrically conductive material such as titanium nitride, although other materials, such as tantalum nitride, titanium, tantalum, or the like, may alternatively be utilized. The barrier layer 113 may be formed using a CVD process, such as plasma-enhanced CVD (PECVD). However, other alternative processes, such as sputtering or metal organic chemical vapor deposition (MOCVD), atomic layer deposition (ALD), may alternatively be used.

Next, a seed layer is formed over the barrier layer 113. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer may include a titanium layer and a copper layer over the titanium layer.

Once the seed layer has been formed, a conductive material 115' is formed over the seed layer. The conductive material 115' may be a suitable conductive material such as copper, although other suitable materials such as aluminum, silver, gold, tungsten, rhodium, molybdenum, nickel, cobalt, cadmium, zinc, alloys of these, combinations thereof, or the like, may alternatively be utilized. The conductive material 115' may be formed by electroplating the conductive material 115' onto the seed layer, filling and overfilling the openings 112.

Figure 4:
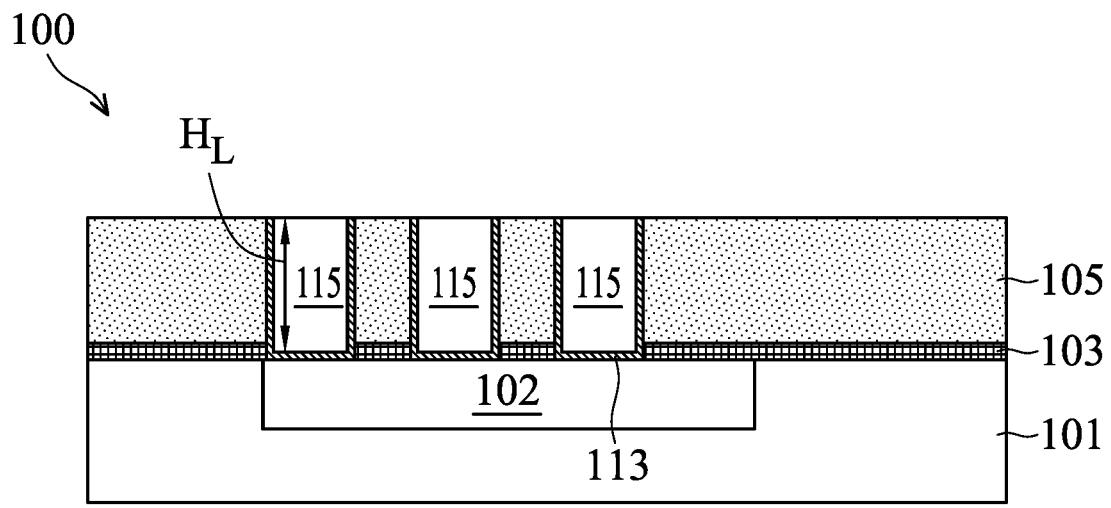

Next, in FIG. 4, a planarization process, such as chemical and mechanical planarization (CMP), is performed. In the example of FIG. 4, the planarization process is controlled to stop when the dielectric layer 105 is exposed, or when a target height $H_L$ for the remaining portions of the conductive material 115' is reached. In some embodiments, the height $H_L$ is between about 150 angstroms and about 250 angstroms. After the planarization process, the remaining portions of the conductive material 115' form conductive lines 115, which conductive lines 115 have upper surfaces that are level with the upper surface of the dielectric layer 105 (or the remaining portions thereof). The conductive lines 115 are electrically coupled to the conductive features (e.g., gate contacts and/or source/drain contacts of underlying transistors) in the device region 102.

Figure 5:
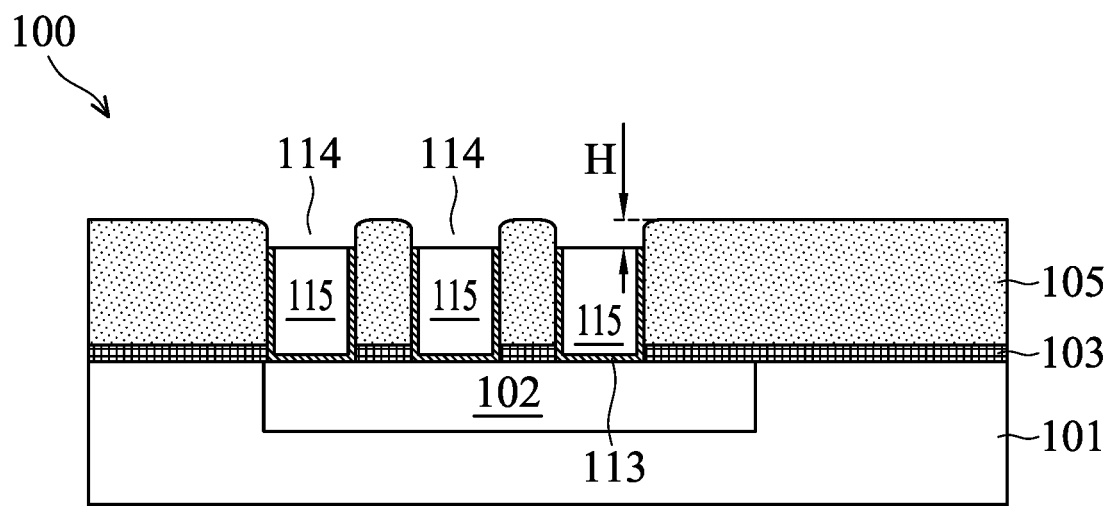

Referring next to FIG. 5, the upper surfaces of the conductive lines 115 are recessed such that the upper surfaces of the conductive lines 115 are closer to the substrate 101 than the upper surface of the dielectric layer 105. In some embodiments, an etching process, such as a wet etch, is performed to recess the conductive lines 115. The wet etch may use a chemical(s) that is selective to (e.g., having a higher etching rate for) the material of the conductive lines 115. In the illustrated embodiment, the conductive lines 115 are copper lines, and the chemical used in the wet etch is ammonium hydroxide (e.g., $NH_4OH$, may also be referred to as ammonium solution), which comprises ammonium and deionized (DI) water.

In some embodiments, the wet etch process is controlled to achieve a target distance H between the upper surface of the dielectric layer 105 and the upper surface of the conductive line 115. The target distance H is between about 30 angstroms and about 50 angstroms, in the illustrated embodiment. In some embodiments, if the target distance H is smaller than about 30 angstroms, some advantages of the present disclosure, such as reduced leakage current and reduced chance of electrical short (see discussion below with reference to FIG. 8), may not be sufficiently achieved. On the other hand, if the target distance H is larger than 50 angstroms, there may be too much loss of material for the conductive line 115, and the electrical resistance of the conductive line 115 may be too high. In some embodiments, the duration of the wet etch and/or the pH value of the ammonium solution are controlled to achieve a targeted amount of recessing for the conductive line 115 (thus the distance H). For example, the duration of the wet etch process may be controlled to last for about 2 minutes to about 3 minutes, and the pH value of the ammonium solution may be controlled to be between about 9 and about 11. In some embodiments, the conductive line 115 is formed of copper, and the barrier layer 113 is formed of tantalum, tantalum nitride, and/or cobalt, by controlling the pH value between about 9 and about 11, an etching selectivity of the ammonium solution between the conductive line 115 and the barrier layer 113 is achieved. To control the pH value, electrodes may be submerged in the ammonium solution used in the wet etch process, and electrical current may be applied to the electrodes to adjust the pH value of the ammonium solution. After the wet etch process, recesses 114 are formed in the dielectric layer 105 (e.g., over the upper surfaces of the conductive lines 115).

Figure 6:
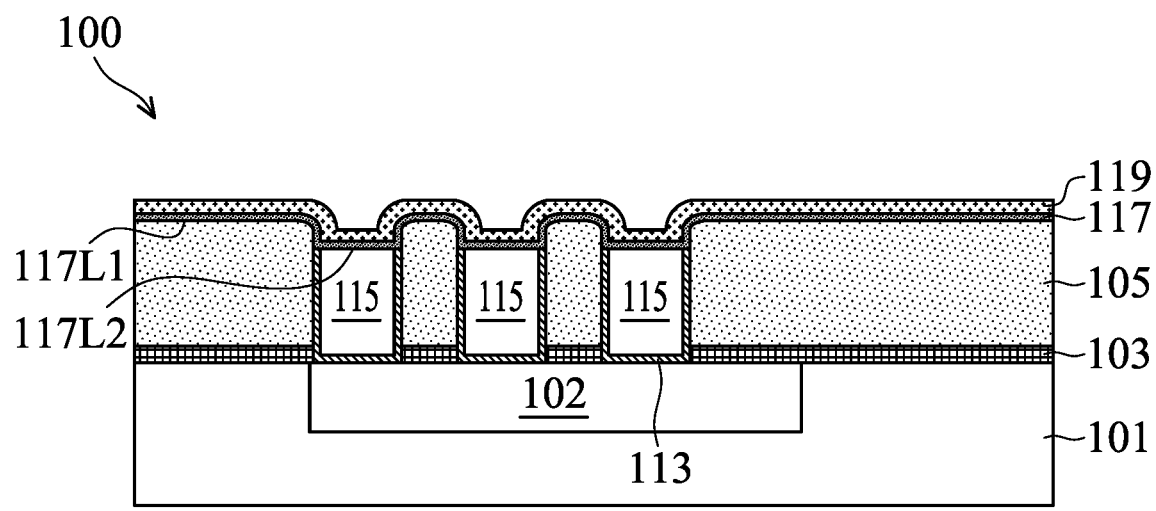

Next, in FIG. 6, an ESL 117 is formed (e.g., conformally) over the semiconductor device 100 of FIG. 5, and a protection layer 119 is formed (e.g., conformally) over the ESL 117. The ESL 117 extends along the upper surface of the dielectric layer 105, and lines the sidewalls and the bottoms of the recesses 114. The ESL 117 may be formed of any suitable dielectric material such as silicon nitride, silicon carbonitride, combinations thereof, or the like. In an embodiment, the ESL 117 is formed of aluminum oxide (e.g., $AlO_x$), and the protection layer 119 is formed of oxygen doped carbide (ODC). Since ODC is hydrophobic, the protection layer 119 prevents or reduces moisture related damages to the conductive lines 115, such as oxidization or erosion, in some embodiments. Due to the recesses 114, the ESL 117 is non-planar, and has a lower surface 117L1 that physically contacts and extends along the upper surface of the dielectric layer 105. The ESL 117 also has another lower surface 117L2 that physically contacts and extends along the upper surface of the conductive lines 115. The lower surface 117L2 is closer to the substrate 101 than the lower surface 117L1. In the illustrated example, the lower surfaces 117L1 is parallel (e.g., parallel within the limitations of manufacturing) to the upper surface of the substrate 101. Although the conductive line 115 is illustrated to have a flat upper surface, depending on various factors (e.g., pH value of the ammonium solution) of the wet etch process used to recess the conductive line 115, the conductive line 115 may have a non-flat upper surface, such as a concave upper surface.

In some embodiments, the ESL 117 comprises aluminum oxide, and is formed by a CVD process using a precursor comprising oxygen (such as $O_2$ and $CO_2$) and a precursor comprising aluminum radicals. A thickness of the ESL 117 is between about 20 angstroms and about 30 angstroms. In some embodiments, the protection layer 119 comprises oxygen doped carbide, and is formed by a PVD process. A thickness of the protection layer 119 is between about 30 angstroms and about 70 angstroms, such as 50 angstroms.

Figure 7:
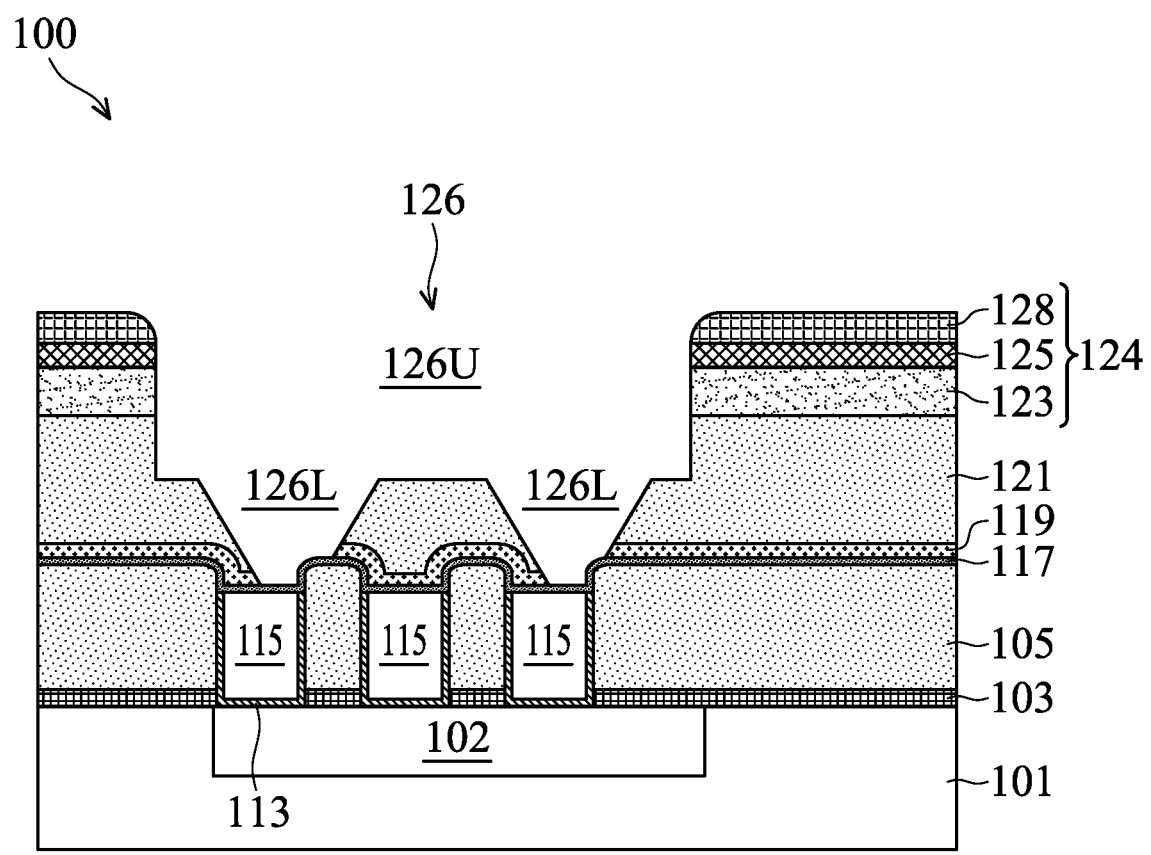

Referring next to FIG. 7, a dielectric layer 121 is formed over the protection layer 119 and the ESL 117, and a film stack 124 is formed over the dielectric layer 121. The dielectric layer 121 may comprise a same or similar material as the dielectric layer 105, and may be formed by a same or similar method, thus details are not repeated. The film stack 124 may include a dielectric layer 123 (e.g., a TEOS-formed oxide layer), a dielectric layer 125 (e.g., a silicon carbide layer), and a dielectric layer 128 (e.g., a titanium nitride layer) that are formed by suitable formation methods, such as CVD, PVD, spin-coating, combinations thereof, or the like. The number of sublayers and the materials of the sublayers in the film stack 124 illustrated in FIG. 7 are illustrative and non-limiting, and may be determined by factors such as the photolithography and etching processes performed subsequently. Other numbers of sublayers and other materials for the sublayers of the film stack 124 are also possible and are fully intended to be included in the scope of the present disclosure.

Next, the film stack 124, the dielectric layer 121, and the protection layer 119 are patterned, e.g., using photolithograph and etching techniques, to form openings 126. The openings 126 may be formed using one or more etching processes, e.g., using a dual-damascene etching process such that each of the openings 126 has an upper trench 126U and one or more lower trenches 126L. As illustrated in FIG. 7, the openings 126 extend through the film stack 124, the dielectric layer 121, the protection layer 119, and expose the ESL 117. In the illustrated embodiment, the etching process (es) to form the openings 126 may be selective to the materials of the dielectric layer 121, the film stack 124, and the protection layer 119, and therefore, the ESL 117 remain substantially un-etched after the etching process(es). The number of conductive lines 115, the number of openings 126, the relative locations of the conductive lines 115 and the relative locations of the openings 126 in FIG. 7 are illustrative and non-limiting, other numbers and other relative locations are also possible and are fully intended to be included within the scope of the present disclosure.

In some embodiments, a plasma etching process is performed to form the openings 126. The plasma etching process may be performed under a pressure between about 20 mTorr and about 80 mTorr, and at a temperature between about 0° C. and about 50° C. The plasma etching process may use a gas comprising a compound of carbon and fluoride, which is denoted as $C_xF_y$ (e.g., $CF_4$, or $C_4F_8$). In an embodiment, the plasma etching process uses a gas mixture comprising $C_xF_y$, $N_2$, $O_2$ and Ar. A flow rate of $C_xF_y$ may be between about 20 standard cubic centimeters per minute (sccm) and about 50 sccm, a flow rate of $N_2$ may be between about 10 sccm and about 100 sccm, a flow rate of $O_2$ may be between about 5 sccm and about 25 sccm, and a flow rate of Ar may be between about 600 sccm and about 1200 sccm. In addition, the gas mixture may optionally include $H_2$ or $CH_xF_y$ to control the profile (e.g., profile of the sidewalls of the dielectric layer 121 exposed by the openings 126) of the dielectric layer 121 (e.g., silicon oxide) during the etching. For example, an H-containing gas (e.g., $H_2$) may be added to the gas mixture to control depth loading and to control the critical dimension (CD) of the vias (see, e.g., 129V in FIG. 8) to be formed subsequently. The H-containing gas may help shrink the CD of the vias (e.g., by shrinking the CD of the lower trench 126L) and control metal depth loading on different CDs of the vias. In embodiment where $H_2$ is used in the gas mixture, the flow rate of $H_2$ is between about 0 sccm and about 100 sccm. In embodiment where $CH_xF_y$ is used in the gas mixture, the flow rate of $CH_xF_y$ is between about 0 sccm and about 100 sccm.

To activate the gas mixture into plasma, a radio frequency (RF) source is used, which RF source may have a voltage supply between about 0 volt and about 1000 volts, and may have an RF power between, e.g., about 200 watts and about 500 watts with different source frequencies. The RF power may be adjusted for different aspect ratios of the openings (e.g., 126U, 126L) to maintain a target etching capability. For example, the RF source may have an RF power between about 200 watts and about 500 watts at the beginning of the plasma etching process, and as the plasma etching process proceeds, the RF power may be increased to between about 200 watts and about 1000 watts.

Figure 8:
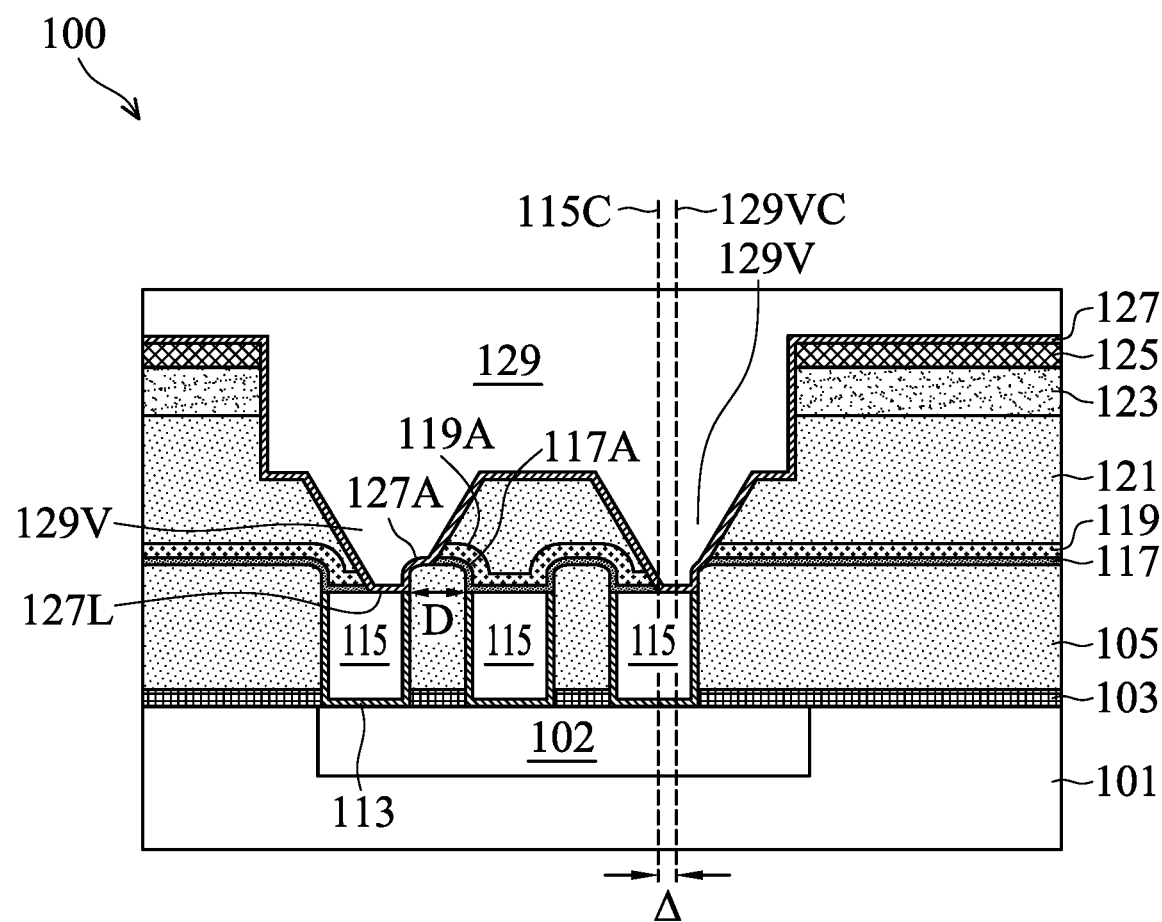

Next, in FIG. 8, portions of the ESL 117 exposed by the openings 126 (e.g., 126L) are removed to expose the underlying conductive lines 115. The upper surface of the dielectric layer 105 may also be exposed by the removal of the ESL 117, e.g., due to misalignment between the openings 126 and the respective conductive lines 115. In other words, the openings 126 are extended by the removal of the ESL 117 to expose the conductive lines 115 and to expose the upper surface of the dielectric layer 105. In an embodiment, a wet etch process using a fluoride-containing chemical is performed to remove the exposed portions of the ESL 117. In some embodiments, the pH value of the fluoride-containing chemical is controlled to be neutral (e.g., pH value is 7) during the wet etch process, such that the fluoride-containing chemical selectively removes the exposed portions of the ESL 117 without substantially attacking the underlying conductive line 115.

Next, a barrier layer 127 is formed (e.g., conformally) lining sidewalls and bottoms of the (extended) openings 126. The barrier layer 127 also physically contacts and extends along the exposed upper surface of the dielectric layer 105. A seed layer is then formed over the barrier layer 127, and an electrically conductive material 129, such as a fill metal, is formed over the seed layer to fill the openings 126. Portions of the conductive material 129 filling the lower trenches 126L form the vias 129V.

As feature size in semiconductor manufacturing continues to shrink, it has become increasingly difficult to control the alignment between different features formed on different layers of the semiconductor device. For example, photolithography and etching techniques use masks (also referred to as photo masks) to control the exposure and to form different features in different layers of the semiconductor device. In advanced processing nodes, minute shift between masks may occur (referred to as overlay shift), which will cause features formed in different layers to have unintended offsets (e.g., location change) from the original design locations.

In the example of FIG. 8, due to overlay shift, the center axis 129VC of the via 129V (see also FIG. 9) has an offset A from the center axis 115C of a respective conductive line 115 underlying the via 129V. As a result of the offset A, the lower surface of the via 129V, which may be originally designed to have substantially a same width as the upper surface of the conductive line 115, is not aligned perfectly with the upper surface of the respective conductive line 115. Therefore, a portion of the lower surface of the via 129V extends beyond sidewalls of the respective conductive line 115. Since the barrier layer 127 is conformal to the surfaces of the via 129V, the misalignment between the via 129V and the underlying conductive line 115 causes the barrier layer 127 to have a first portion 127L covering (e.g., physically contacting and extending along) the upper surface of the underlying conductive line 115, and to have a second portion 127A contacting and extending along the upper surface of a portion of the dielectric layer 105 immediately adjacent to the underlying conductive line 115. As illustrated in FIG. 8, due to the overlay shift, a portion of the ESL 117 and a portion of the protection layer 119 disposed on the upper surface of the conductive line 115 is not removed by the plasma etching process, and therefore, remain on the upper surface of the conductive line 115. Furthermore, in FIG. 8, the upper surface of the portion of dielectric layer 105 between adjacent conductive lines 115 has a first portion covered by the barrier layer 127 (e.g., 127A), and has a second portion covered by the ESL 117 (e.g., a portion of 117 labeled as 117A).

In FIG. 8, the second portion 127A of the barrier layer 127 and a portion of the via 129V directly above the second portion 127A extend upward above the upper surface of the conductive line 115. This upward extension of the via 129V helps to maintains a minimum distance D between the via 129V and a laterally adjacent (e.g., immediately adjacent) conductive line 115, where the minimum distance D is equal to a distance between adjacent conductive lines 115 in the illustrated example. The ability to maintain a minimum distance D between the via 129V and adjacent conductive lines 115 improves device performance by reducing the leakage current between the via 129V and adjacent conductive lines 115, and by reducing the chance of electrical short (e.g., short circuit) between the via 129V and adjacent conductive lines 115, which illustrates an advantage of the present disclosed methods.

The above described advantage may be better appreciated by considering a reference design where the conductive lines 115 are not recessed, and the ESL 117 is formed as a flat (e.g., planar) layer over the conductive line 115 and over the dielectric layer 105, in which case the overlay shift would cause the via 129V to shift laterally toward a laterally adjacent conductive line 115, which may results in short circuit and/or increased leakage current. As another example to illustrate the advantage of the presently disclosed methods, consider a scenario where the etching process to remove the exposed (e.g., exposed by the opening 126 in FIG. 7) portions of the ESL 117 over-etches and removes portions of the dielectric layer 105 under the exposed portions of the ESL 117. The overlay shift and the over-etching would cause recesses to be formed immediately adjacent the conductive lines 115 in the above mentioned references design, and these recesses would be filled when the conductive material 129 is formed, thereby forming unwanted portions of the conductive material 129 between adjacent conductive lines 115, which may cause increased leakage current and/or electrical short. In contrast, the presently disclosed methods, due to the conductive lines 115 being recessed from the upper surface of the dielectric layer 105, provides improved tolerance for over-etching and may still be able to maintain a minimum distance D between the via 129V and the adjacent conductive lines 115, thus reducing leakage current and/or the occurrence of electrical short.

Recall that in the processing of FIG. 5, the wet etch process to recess the conductive line 115 is controlled to achieve a distance H between the upper surface of the dielectric layer 105 and the upper surface of the conductive line 115, where the distance H is between about 30 angstroms and about 50 angstroms. The lower boundary (e.g., 30 angstroms) of the distance H is chosen to provide a target level of protection against over-etching. For example, by having a minimum distance H of about 30 angstroms, in the subsequent etching process to remove exposed portions of the ESL 117, an over-etching of 30 angstroms may be tolerated without causing a reduction of the minimum distance D between the via 129V and the adjacent conductive lines 115. If the distance H is too small (e.g., smaller than about 30 angstroms), the level of protection against over-etching may not be enough, and over-etching may result in reduction of the minimum distance D, which in turn may result in increased current leakage and/or electrical short. On the other hand, if the distance H too large (e.g., larger than about 50 angstroms), the aspect ratio (e.g., height over width) of the recesses 114 (see FIG. 5) may be too large, and it may be difficult to form the conformal ESL 117 in the recesses 114, and therefore, discontinuity (e.g., holes) may occur in the ESL 117 formed, which negatively affect the function of the ESL 117 and may result in increased leakage current and/or short circuit.

Figure 9:
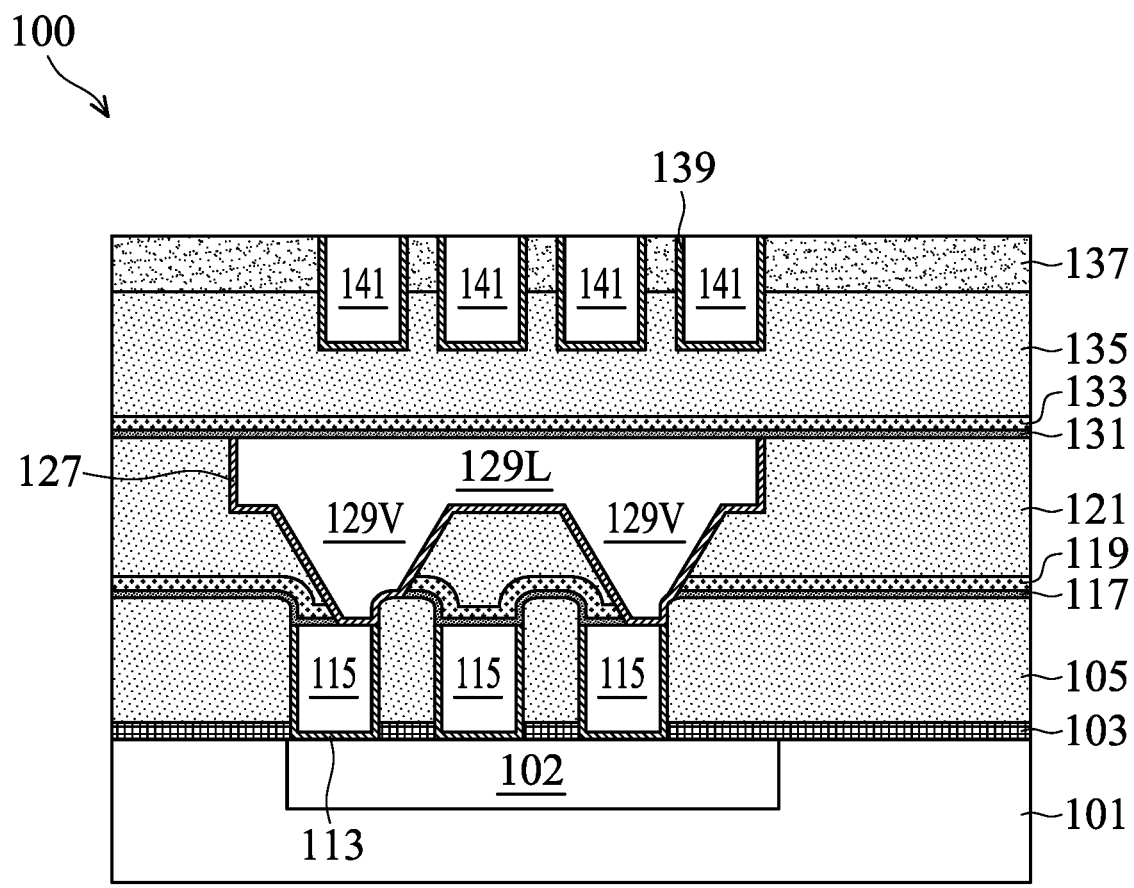

Referring now to FIG. 9, a planarization process, such as CMP, is performed to remove layers over the dielectric layer 121. After the planarization process, remaining portions of the conductive material 129 in the upper trench 126U (see FIG. 7) form conductive lines 129L, and remaining portions of the conductive material 129 in the lower trench 126L (see FIG. 7) form the vias 129V.

Next, an ESL 131 is formed over the dielectric layer 121 and over the conductive lines 129L, and a protection layer 133 is formed over the ESL 131. The ESL 131 may be the same or similar to the ESL 117 (e.g., $AlO_x$), and the protection layer 133 may be the same or similar to the protection layer 119 (e.g., ODC), thus details are not repeated. Next, additional dielectric layers, such as a dielectric layer 135 (which may be the same or similar as the dielectric layer 105) and a dielectric layer 137 (which may be a TEOS-formed oxide layer) are formed over the protection layer 133, and conductive lines 141 with barrier layer 139 are formed in the dielectric layers 135 and 137, using processing steps similar to those described above. Additional processing may be performed after the processing of FIG. 9 to fabricate the semiconductor device 100, as skilled artisans readily appreciate. Details are not discussed here.

Figure 10:
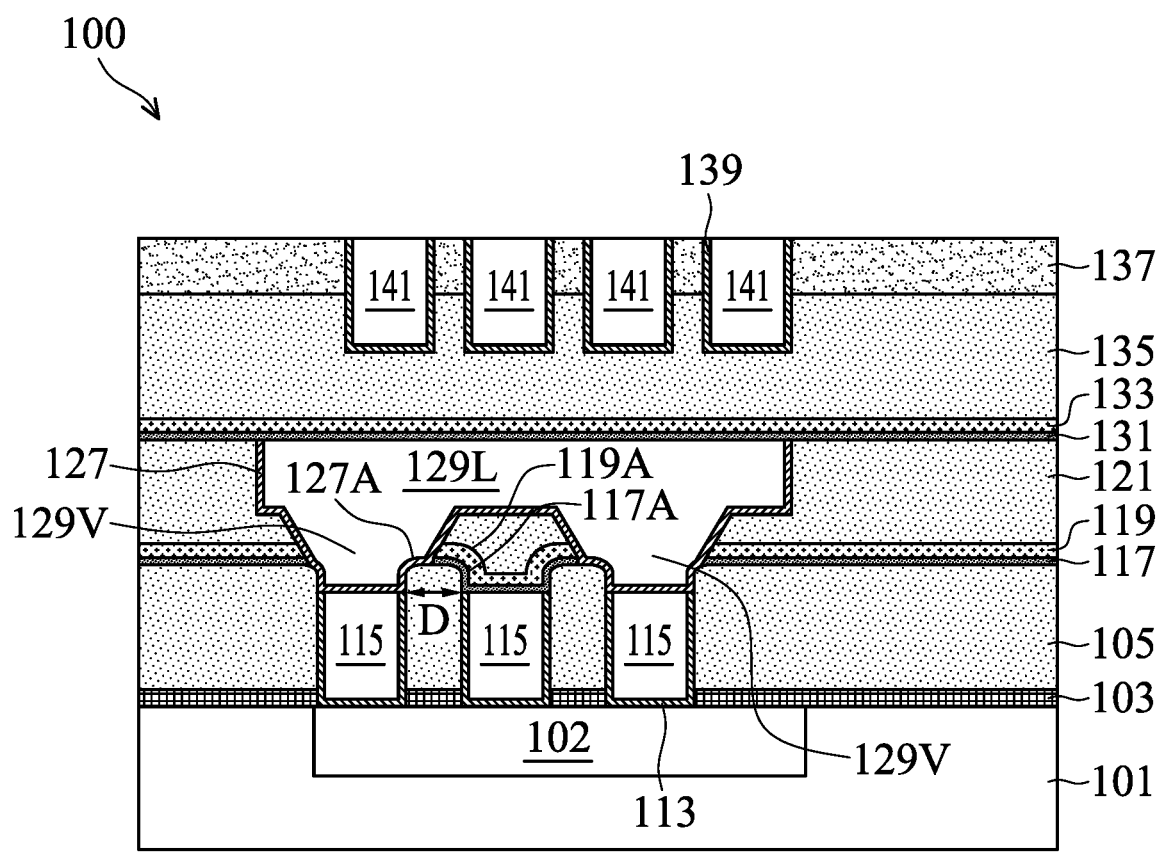
FIG. 10 illustrates an alternative cross-sectional view of the semiconductor device of FIG. 9, in accordance with an embodiment.

Depending on factors such as the width of the vias 129V, the width of the conductive lines 115, and the offset A (see FIG. 8) between the center axis 129VC of the via 129V and the center axis 115C of the conductive line 115, the semiconductor device 100 may have different cross-sectional views than FIG. 9. For example, FIG. 10 illustrates an alternative cross-sectional view of the semiconductor device 100 of FIG. 9, when the width of the via 129V is larger than the sum of the width of the underlying conductive line 115 and the offset A. As a result, in the example of FIG. 10, the barrier layer 127 completely covers the upper surface of the underlying conductive line 115 that is electrically coupled to the via 129V. In addition, portions of the barrier layer 127 (e.g., 127A) disposed beyond the sidewalls of the conductive line 115 extend upwards along the upper surface of the dielectric layer 105, which helps to maintain the minimum distance D between the via 129V and the laterally adjacent conductive line 115, thereby reducing the leakage current and/or possibility of electrical short. In FIG. 10, the upper surface of the portion of dielectric layer 105 between adjacent conductive lines 115 has a first portion covered by the barrier layer 127 (e.g., 127A), and has a second portion covered by the ESL 117 (e.g., 117A). As illustrated in FIGS. 9 and 10, the ESL 117 and the recessed conductive line 115 help to the vias 129V to be formed in a self-aligned manner.

Figure 11:
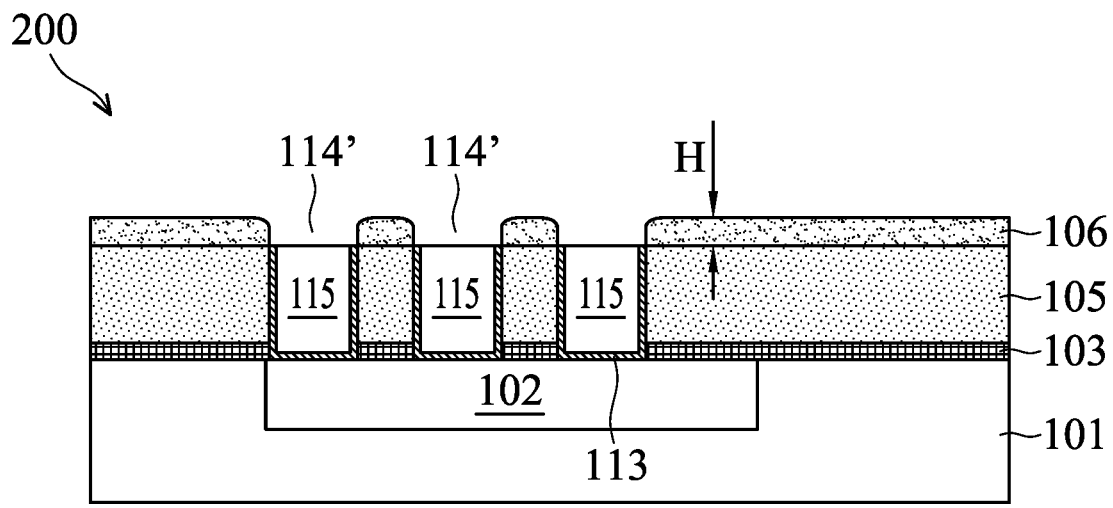
FIGS. 11-13 are cross-sectional views of a semiconductor device at various stages of manufacturing, in accordance with an embodiment.
Figure 12:
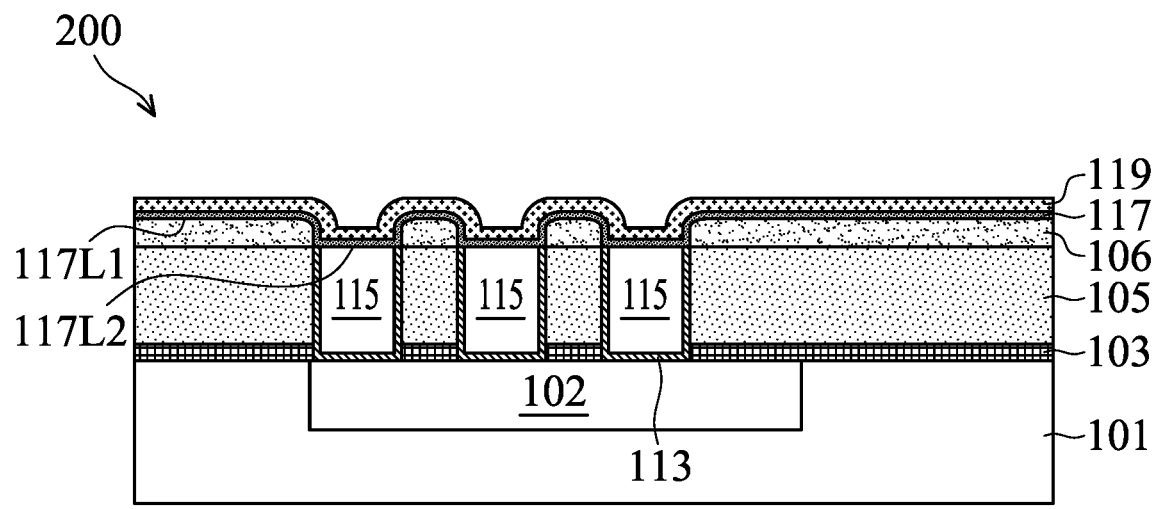
Figure 13:
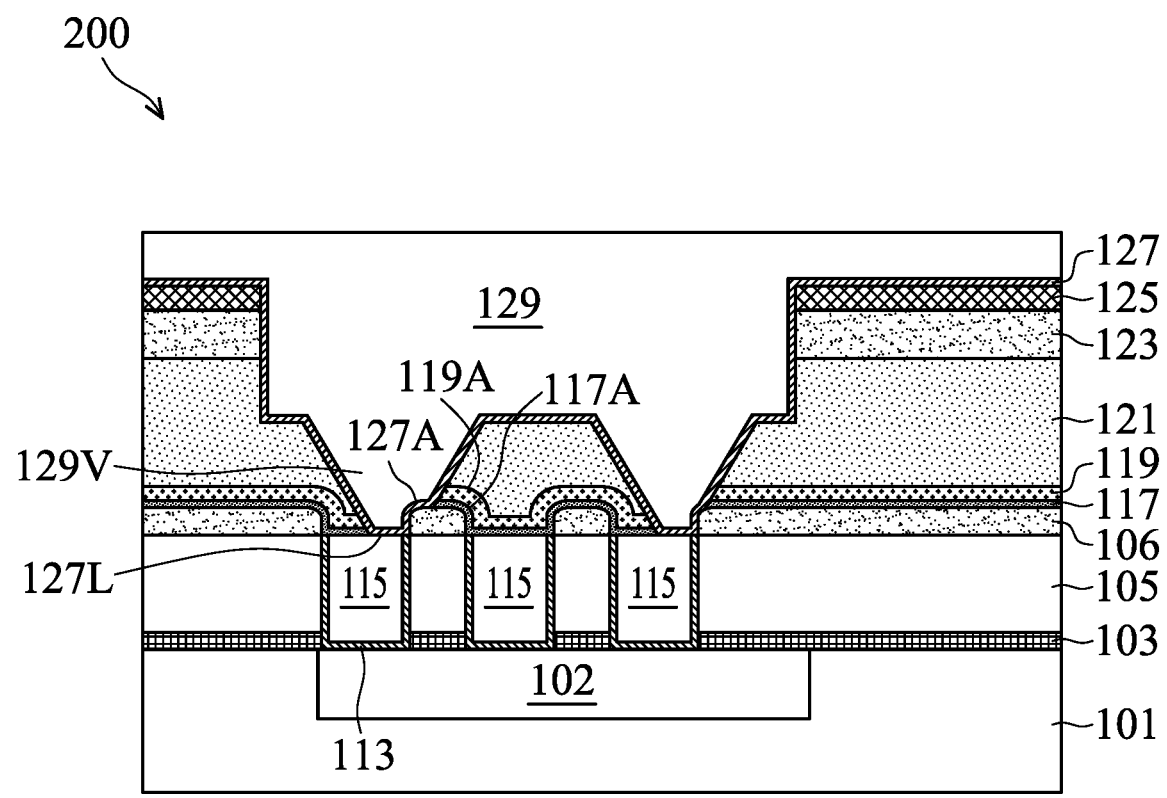

FIGS. 11-13 are cross-sectional views of a semiconductor device 200 at various stages of manufacturing, in accordance with an embodiment. The processing of FIG. 11 may follow the processing illustrated in FIG. 4, and therefore, FIGS. 1-4, and 11-13 illustrate another embodiment processing method.

In FIG. 11, a dielectric layer 106 is selectively formed on the upper surface of the dielectric layer 105. In some embodiments, the dielectric layer 106 comprises silicon oxide, and is formed by a deposition process (e.g., a CVD process) using a first precursor comprising silane (e.g., $SiH_4$) and a second precursor comprising oxygen (e.g., $O_2$). Since the upper surfaces of the conductive lines 115 (e.g., copper) are not conducive to the formation of silicon oxide, the deposition rate of silicon oxide on the dielectric layer 105 (e.g., silicon oxide) is much higher than that on the conductive lines 115, in the illustrated embodiment. As a result, the dielectric layer 106 is selectively formed on the dielectric layer 105, while little or no dielectric layer 106 is formed over the conductive lines 115. In other embodiments, the dielectric layer 106 may be blanket deposited over the dielectric layer 105 and over the conductive lines 115, and a subsequent etching process may be performed (e.g., using photolithography and etching techniques) to remove portions of the dielectric layer 106 over the conductive lines 115.

In some embodiments, during the deposition process for the dielectric layer 106, a flow rate of silane is in a range between about 50 sccm and about 100 sccm, and a flow rate of oxygen is in a range between about 5 sccm and about 10 sccm. A temperature of the deposition process is between about 300° C. and about 500° C., and a pressure of the deposition process is between about 75 mTorr and about 200 mTorr, in some embodiments. A thickness of the dielectric layer 106 formed is between about 30 angstroms and about 50 angstroms, such that the upper surfaces of the conductive lines 115 are recessed from the upper surface of the dielectric layer 106 by a distance H that is equal to the thickness of the dielectric layer 106. As illustrated in FIG. 11, recesses 114' are formed in the dielectric layer 106 over the conductive lines 115.

Next, in FIG. 12, the ESL 117 and the protection layer 119 are formed successively over the upper surface of the dielectric layer 106 and along sidewalls and bottoms of the recesses 114'. Details are the same or similar to those discussed above with reference to FIG. 6, thus not repeated here.

Due to the recesses 114', the ESL 117 is non-planar, and has a lower surface 117L1 that physically contacts and extends along the upper surface of the dielectric layer 106. The ESL 117 also has another lower surface 117L2 that physically contacts and extends along the upper surface of the conductive line 115. The lower surface 117L2 is closer to the substrate 101 than the lower surface 117L1. In the illustrated example, the lower surfaces 117L1 and 117L2 are parallel (e.g., parallel within the limitations of manufacturing) to each other, and are parallel (e.g., parallel within the limitations of manufacturing) to the upper surface of the substrate 101.

Next, in FIG. 13, processing steps same or similar to those illustrated in FIGS. 7 and 8 are performed to form the semiconductor device 200 illustrated in FIG. 13. In particular, the dielectric layer 121 is formed over the protection layer 119, and a film stack, which includes a plurality of dielectric layers (e.g., 123, 125) are formed over the dielectric layer 121. Next, openings (see, e.g., 126 in FIG. 7) are formed in the dielectric layer 121 to expose portions of the ESL 117. The exposed portions of the ESL 117 are then removed to expose the underlying conductive lines 115. Next, the barrier layer 127 is formed, followed by the formation of the seed layer and the conductive material 129 over the seed layer. Details are the same or similar to the discussion above with reference to FIGS. 7 and 8, thus are not repeated here.

In FIG. 13, the ESL 117 covers a first portion of the upper surface of the conductive line 115 (e.g., the leftmost or the rightmost conductive line 115 in FIG. 13) electrically coupled to a respective via 129V, and the barrier layer 127 (e.g., 127L) covers a second portion of the upper surface of the conductive line 115. In addition, the upper surface of the portion of dielectric layer 105 between adjacent conductive lines 115 has a first portion covered by the barrier layer 127 (e.g., 127A), and has a second portion covered by the ESL 117 (e.g., 117A). Additional processing may be performed after the processing of FIG. 13 to fabricate the semiconductor device 200, as skilled artisans readily appreciate. Details are not discussed here.

Figure 14:
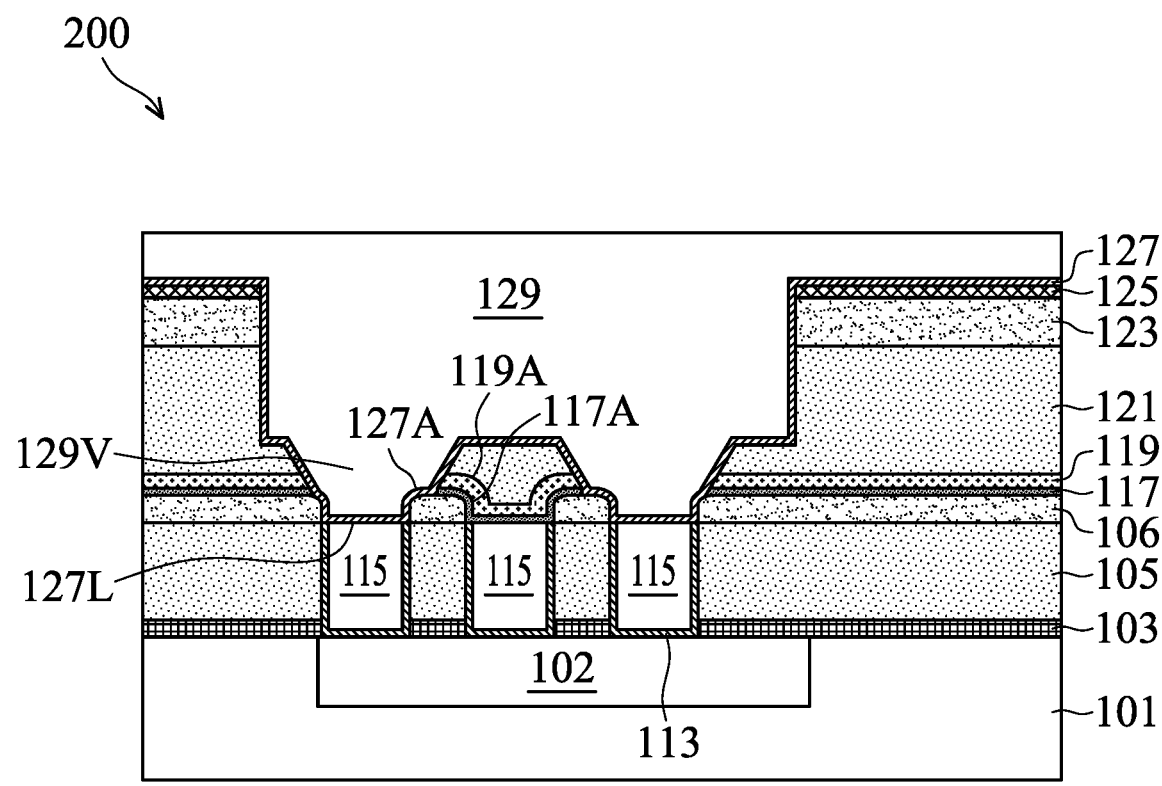
FIG. 14 illustrates an alternative cross-sectional view of the semiconductor device of FIG. 13, in accordance with an embodiment.

Depending on factors such as the width of the vias 129V, the width of the conductive lines 115, and the offset A (see FIG. 8) between the center axis 129VC of the via 129V and the center axis 115C of the conductive line 115, the semiconductor device 200 may have a different cross-sectional view than FIG. 13. FIG. 14 is an alternative cross-sectional views of the semiconductor device 200 of FIG. 12, where the width of the via 129V is larger than the sum of the width of the underlying conductive line 115 and the offset A. As a result, in the example of FIG. 14, the barrier layer 127 completely covers the upper surface of the underlying conductive line 115 electrically coupled to the via 129V. In addition, portions of the barrier layer 127 (e.g., 127A) disposed beyond the sidewalls of the conductive line 115 extend upwards along the upper surface of the dielectric layer 105, which helps to maintain the minimum distance D between the via 129V and the laterally adjacent conductive line 115, thereby reducing the leakage current and/or possibility of electrical short. In FIG. 14, the upper surface of the portion of dielectric layer 105 between adjacent conductive lines 115 has a first portion covered by the barrier layer 127 (e.g., 127A), and has a second portion covered by the ESL 117 (e.g., 117A).

Variations to the disclosed embodiments are possible and are fully intended to be included in the scope of the present disclosure. For example, while the various embodiments disclosed herein uses formation of the first via layer (also referred to as Via0 layer) over the devices (e.g., transistors) in the device region 102 as examples, the disclosed methods may be applied to other via layers over the first via layers. While the vias 129V and the conductive lines 129L are illustrated as being formed in a dual-damascene process, any suitable process may be used to form the conductive lines 129L and the vias 129V.

Figure 15:
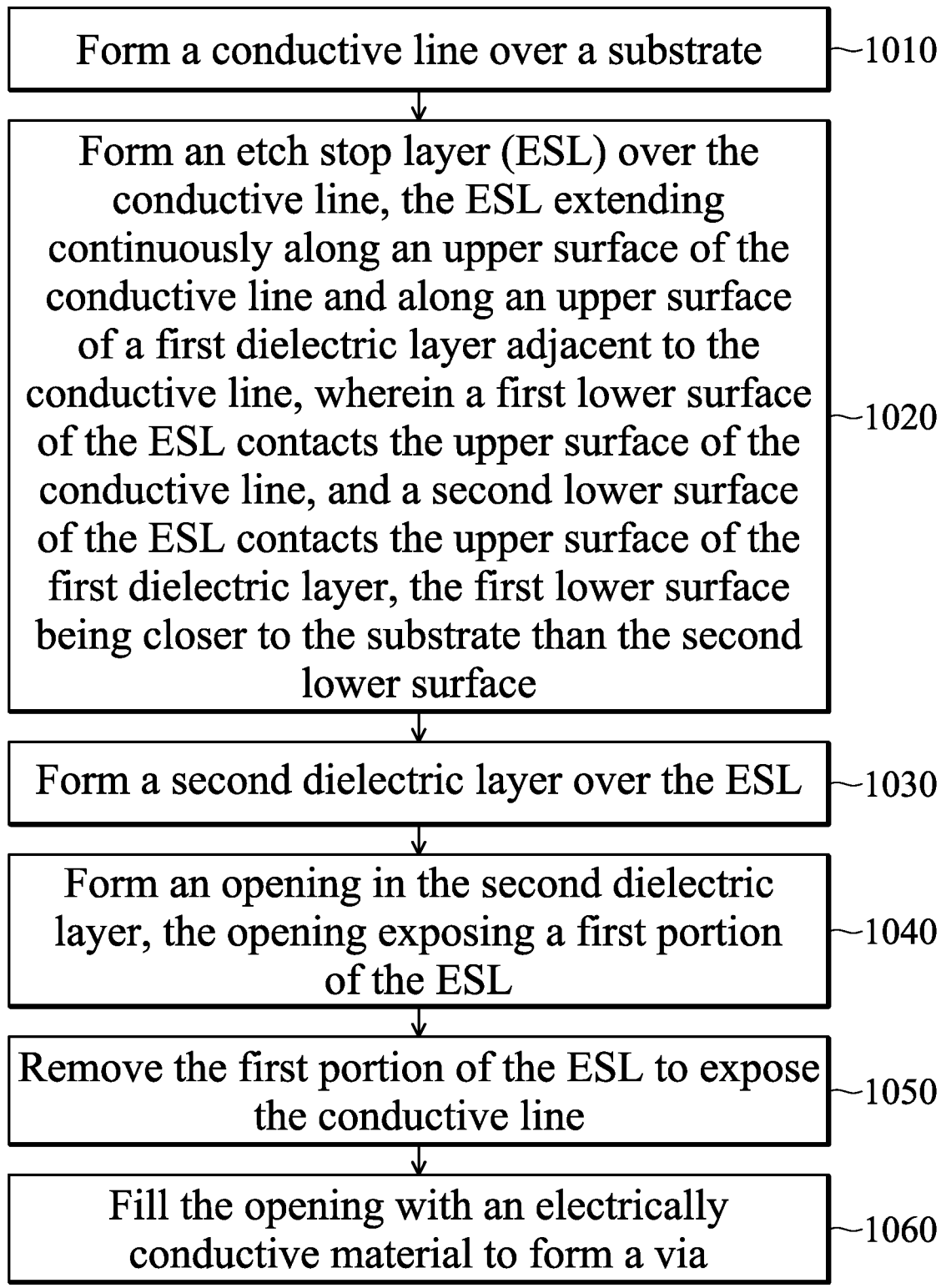
FIG. 15 is a flow chart for a method of forming a semiconductor device, in some embodiments.

FIG. 15 is a flow chart of a method of fabricating a semiconductor structure, in accordance with some embodiments. It should be understood that the embodiment method shown in FIG. 15 is merely an example of many possible embodiment methods. One of ordinary skill in the art would recognize many variations, alternatives, and modifications. For example, various steps as illustrated in FIG. 15 may be added, removed, replaced, rearranged and repeated.

Referring to FIG. 15, at block 1010, a conductive line is formed over a substrate. At block 1020, an etch stop layer (ESL) is formed over the conductive line, the ESL extending continuously along an upper surface of the conductive line and along an upper surface of a first dielectric layer adjacent to the conductive line, wherein a first lower surface of the ESL contacts the upper surface of the conductive line, and a second lower surface of the ESL contacts the upper surface of the first dielectric layer, the first lower surface being closer to the substrate than the second lower surface. At block 1030, a second dielectric layer is formed over the ESL. At block 1040, an opening is formed in the second dielectric layer, the opening exposing a first portion of the ESL. At block 1050, the first portion of the ESL is removed to expose the conductive line. At block 1060, the opening is filled with an electrically conductive material to form a via.

Embodiments may achieve advantages. For example, by recessing the conductive lines 115 below the upper surface of the dielectric layer 105 (see, e.g., FIG. 6), or by selectively forming the dielectric layer 106 over the dielectric layer 105 (see, e.g., FIG. 12), the ESL 117 is a non-planar layer, with a first lower surface contacting the conductive lines 115 and a second lower surface higher than the first lower surface. The distance H between the first lower surface and the second lower surface provides protection against over-etching of the ESL 117, and help to maintain a minimum distance D between the via 129V and laterally adjacent conductive lines 115, thus reducing the leakage current and/or the possibility of short circuit. The vias 129V are formed in a self-aligned manner due to the shape of the non-planar ESL 117, which may reduce the precision requirements for the photolithography process to form the openings 126, which in turn reduces manufacturing cost.

In an embodiment, a method of forming a semiconductor device includes forming a conductive line over a substrate; forming an etch stop layer (ESL) over the conductive line, the ESL extending continuously along an upper surface of the conductive line and along an upper surface of a first dielectric layer adjacent to the conductive line, where a first lower surface of the ESL contacts the upper surface of the conductive line, and a second lower surface of the ESL contacts the upper surface of the first dielectric layer, the first lower surface being closer to the substrate than the second lower surface; forming a second dielectric layer over the ESL; forming an opening in the second dielectric layer, the opening exposing a first portion of the ESL; removing the first portion of the ESL to expose the conductive line; and filling the opening with an electrically conductive material to form a via. In an embodiment, forming the conductive line includes forming the conductive line in the first dielectric layer such that the conductive line and the first dielectric layer have a same level upper surface, wherein forming the etch stop layer includes: recessing the upper surface of the conductive line below the upper surface of the first dielectric layer; and conformally forming the ESL over the upper surface of the first dielectric layer and over the recessed upper surface of the conductive line. In an embodiment, recessing the upper surface of the conductive line includes performing a wet etch that is selective to the conductive line. In an embodiment, the conductive line is a copper line, and wherein the wet etch is performed using ammonium hydroxide. In an embodiment, conformally forming the ESL includes conformally forming a layer comprising metal oxide over the upper surface of the first dielectric layer and over the recessed upper surface of the conductive line, where the method further includes conformally forming a layer comprising a dielectric material over the ESL before forming the second dielectric layer. In an embodiment, filling the opening includes forming a barrier layer lining a bottom and sidewalls of the opening; and filling the opening with a metal material. In an embodiment, the barrier layer covers a first portion of the upper surface of the conductive line, wherein the ESL covers a second portion of the upper surface of the conductive line. In an embodiment, forming the conductive line includes forming the conductive line in a third dielectric layer such that the conductive line and the third dielectric layer have a same level upper surface distal the substrate, wherein forming the etch stop layer includes selectively forming the first dielectric layer over the third dielectric layer, the first dielectric layer exposing the upper surface of the conductive line; and conformally forming the ESL over the upper surface of the first dielectric layer and over the upper surface of the conductive line. In an embodiment, selectively forming the first dielectric layer includes performing a deposition process using a first precursor comprising silicon and a second precursor comprising oxygen. In an embodiment, a distance between the first lower surface of the ESL and the second lower surface of the ESL is between about 30 angstroms and about 50 angstroms.

In an embodiment, a method of forming a semiconductor device includes forming a conductive line in a first dielectric layer over a substrate, an upper surface of the conductive line being exposed at an upper surface of the first dielectric layer; selectively forming a second dielectric layer on the upper surface of the first dielectric layer, an upper surface of the second dielectric layer extending further from the substrate than the upper surface of the conductive line; forming a third dielectric layer over the second dielectric layer and the conductive line; forming an opening in the third dielectric layer, the opening exposing a first portion of the upper surface of the conducive line and a second portion of the upper surface of the second dielectric layer; and forming a via in the opening, the via being electrically coupled to the conductive line, a lower surface of the via extending along the first portion of the upper surface of the conductive line and the second portion of the upper surface of the second dielectric layer. In an embodiment, the upper surface of the conductive line is formed to be level with the upper surface of the first dielectric layer. In an embodiment, the second dielectric layer comprises silicon oxide, wherein selectively forming the second dielectric layer includes selectively forming the second dielectric layer using a first precursor comprising silicon and a second precursor comprising oxygen. In an embodiment, the upper surface of the second dielectric layer extends further from the substrate than the upper surface of the conductive line by a distance between about 30 angstroms and about 50 angstroms. In an embodiment, the method further includes, before forming the third dielectric layer, forming a conformal etch stop layer over the upper surface of the conductive line and over the upper surface of the second dielectric layer. In an embodiment, forming the opening in the third dielectric layer includes performing a dry etch process to form a first opening in the third dielectric layer, the first opening exposing a portion of the conformal etch stop layer; and performing a wet etch process to remove the exposed portion of the conformal etch stop layer.

In an embodiment, a semiconductor device includes a first dielectric layer over a substrate; a conductive line in the first dielectric layer; a second dielectric layer over the first dielectric layer and the conductive line; and a via in the second dielectric layer and electrically coupled to the conductive line, wherein the via has opposing sidewalls and a bottom surface between the opposing sidewalls, wherein a first portion of the bottom surface of the via extends along an upper surface of the conductive line, and a second portion of the bottom surface of the via extends further from the substrate than the first portion. In an embodiment, an upper surface of the conductive line distal the substrate is closer to the substrate than an upper surface of the first dielectric layer distal the substrate. In an embodiment, the semiconductor device further includes a third dielectric layer between the first dielectric layer and the second dielectric layer, wherein the second portion of the bottom surface of the via extends along an upper surface of the third dielectric layer distal the substrate. In an embodiment, the semiconductor device further includes an etch stop layer between the third dielectric layer and the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a first dielectric layer over a substrate;
   forming a conductive line in the first dielectric layer, wherein forming the conductive line comprises:
   forming a first dielectric film and a second dielectric film successively over the first dielectric layer;
   forming a recess in the second dielectric film using a first etching process, wherein after the first etching process, an upper surface of the first dielectric film distal from the substrate is exposed at a bottom of the recess;
   after the first etching process, extending the recess through the first dielectric film and the first dielectric layer using a second etching process different from the first etching process;
   after extending the recess, filling the recess with a first electrically conductive material, wherein the first electrically conductive material extends along sidewalls of the first dielectric layer, sidewalls of the first dielectric film, and sidewalls of the second dielectric film; and
   after filling the recess, performing a planarization process to remove the first dielectric film, the second dielectric film, and portions of the first electrically conductive material embedded in the first dielectric film and the second dielectric film, wherein remaining portions of the first electrically conductive material embedded in the first dielectric layer form the conductive line;
   forming an etch stop layer (ESL) over the conductive line and over an upper surface of the first dielectric layer distal from the substrate, wherein a first lower surface of the ESL contacting an upper surface of the conductive line is closer to the substrate than a second lower surface of the ESL over the upper surface of the first dielectric layer;
   forming a second dielectric layer over the ESL;
   forming an opening in the second dielectric layer, the opening exposing a first portion of the ESL disposed on the conductive line, exposing a second portion of the ESL disposed along a first sidewall of the first dielectric layer, and exposing a third portion of the ESL disposed on the upper surface of the first dielectric layer, wherein the second portion of the ESL connects the first portion and the third portion of the ESL;

removing the first portion of the ESL to expose the conductive line and removing the second portion and the third portion of the ESL to expose the first sidewall and the upper surface of the first dielectric layer; and filling the opening with a second electrically conductive material to form a via.

2. The method of claim 1, further comprising, after forming the ESL and before forming the second dielectric layer, forming a protection layer over the ESL, wherein the protection layer and the ESL are formed of different materials.

3. The method of claim 2, wherein the opening in the second dielectric layer is formed to extend through the protection layer.

4. The method of claim 2, wherein the ESL is formed of aluminum oxide, and the protection layer is formed of oxygen doped carbide (ODC).

5. The method of claim 1, wherein the planarization process achieves a coplanar upper surface between the conductive line and the first dielectric layer.

6. The method of claim 5, further comprising, after performing the planarization process and before forming the ESL:

recessing the upper surface of the conductive line below the upper surface of the first dielectric layer, wherein forming the ESL comprises conformally forming the ESL over the upper surface of the first dielectric layer and over the recessed upper surface of the conductive line.

7. The method of claim 6, wherein recessing the upper surface of the conductive line comprises selectively etching the conductive line using a wet etch process.

8. The method of claim 5, further comprising, after performing the planarization process and before forming the ESL:

selectively forming a third dielectric layer over the first dielectric layer, wherein after selectively forming the third dielectric layer, the upper surface of the first dielectric layer is covered by the third dielectric layer, the upper surface of the conductive line is exposed by the third dielectric layer, and an upper surface of the third dielectric layer extends further from the substrate than the upper surface of the conductive line, wherein forming the ESL comprises conformally forming the ESL over the upper surface of the third dielectric layer and over the upper surface of the conductive line.

9. The method of claim 8, wherein selectively forming the third dielectric layer comprises performing a deposition process using a first precursor comprising silicon and a second precursor comprising oxygen.

10. The method of claim 1, wherein the via has a bottom surface facing the conductive line, wherein a first portion of the bottom surface of the via extends along the upper surface of the conductive line.

11. A method of forming a semiconductor device, the method comprising:

forming a first dielectric layer over a substrate;

forming a conductive line in the first dielectric layer, wherein forming the conductive line comprises:
forming a first dielectric film and a second dielectric film successively over the first dielectric layer;
forming a recess in the second dielectric film using a first etching process, wherein after the first etching process, an upper surface of the first dielectric film distal from the substrate is exposed at a bottom of the recess;
after the first etching process, extending the recess through the first dielectric film and the first dielectric layer using a second etching process different from the first etching process;
after extending the recess, filling the recess with a first electrically conductive material, wherein the first electrically conductive material extends along sidewalls of the first dielectric layer, sidewalls of the first dielectric film, and sidewalls of the second dielectric film; and
after filling the recess, performing a planarization process to remove the first dielectric film, the second dielectric film, and portions of the first electrically conductive material embedded in the first dielectric film and the second dielectric film, wherein remaining portions of the first electrically conductive material embedded in the first dielectric layer form the conductive line;

forming an etch stop layer (ESL) over the conductive line and over an upper surface of the first dielectric layer distal from the substrate, wherein a first lower surface of the ESL contacting an upper surface of the conductive line is closer to the substrate than a second lower surface of the ESL over the upper surface of the first dielectric layer;

forming a second dielectric layer over the ESL;

forming an opening in the second dielectric layer, the opening exposing a first portion of the ESL disposed on the conductive line, exposing a second portion of the ESL disposed along a first sidewall of the first dielectric layer, and exposing a third portion of the ESL disposed on the upper surface of the first dielectric layer, wherein the second portion of the ESL connects the first portion and the third portion of the ESL;

removing the first portion of the ESL to expose the conductive line and removing the second portion and the third portion of the ESL to expose the first sidewall and the upper surface of the first dielectric layer; and filling the opening with a second electrically conductive material to form a via, wherein the via has a bottom surface facing the substrate, wherein a first portion of the bottom surface of the via extends along the upper surface of the conductive line, and a second portion of the bottom surface of the via extends along the upper surface of the first dielectric layer.

12. The method of claim 11, wherein there is a vertical offset between the first portion of the bottom surface of the via and the second portion of the bottom surface of the via.

13. The method of claim 11, further comprising, after forming the conductive line and before forming the ESL, recessing the conductive line below the upper surface of the first dielectric layer.

14. The method of claim 13, wherein recessing the conductive line comprises performing a wet etch process to selectively remove an upper portion of the conductive line.

15. The method of claim 11, further comprising, after forming the conductive line and before forming the ESL:

selectively forming a third dielectric layer on the upper surface of the first dielectric layer, wherein after selectively forming the third dielectric layer, the upper surface of the first dielectric layer is covered by the third dielectric layer, the upper surface of the conductive line is exposed by the third dielectric layer, and an upper surface of the third dielectric layer extends further from the substrate than the upper surface of the conductive line, wherein the ESL is formed over the conductive line and the third dielectric layer.

16. The method of claim 11, further comprising, after forming the ESL and before forming the second dielectric layer, forming a protection layer over the ESL, wherein the protection layer and the ESL are formed of different materials.

17. A method of forming a semiconductor device, the method comprising:
   forming a first dielectric layer over a substrate;
   forming a conductive line in the first dielectric layer, wherein forming the conductive line comprises:
      forming a first dielectric film and a second dielectric film successively over the first dielectric layer;
      forming a recess in the second dielectric film using a first etching process, wherein after the first etching process, an upper surface of the first dielectric film distal from the substrate is exposed at a bottom of the recess;
      after the first etching process, extending the recess through the first dielectric film and the first dielectric layer using a second etching process different from the first etching process;
      after extending the recess, filling the recess with a first electrically conductive material, wherein the first electrically conductive material extends along sidewalls of the first dielectric layer, sidewalls of the first dielectric film, and sidewalls of the second dielectric film; and
      after filling the recess, performing a planarization process to remove the first dielectric film, the second dielectric film, and portions of the first electrically conductive material embedded in the first dielectric film and the second dielectric film, wherein remaining portions of the first electrically conductive material embedded in the first dielectric layer form the conductive line;
   forming an etch stop layer (ESL) over the conductive line and over an upper surface of the first dielectric layer distal from the substrate, wherein a first lower surface of the ESL contacting an upper surface of the conductive line is closer to the substrate than a second lower surface of the ESL over the upper surface of the first dielectric layer;
   forming a protection layer over the ESL, wherein the protection layer and the ESL are formed of different materials;
   forming a second dielectric layer over the protection layer;
   forming an opening in the second dielectric layer and the protection layer, the opening exposing a first portion of the ESL disposed on the conductive line, exposing a second portion of the ESL disposed along a first sidewall of the first dielectric layer, and exposing a third portion of the ESL disposed on the upper surface of the first dielectric layer, wherein the second portion of the ESL connects the first portion and the third portion of the ESL;
   removing the first portion of the ESL to expose the conductive line and removing the second portion and the third portion of the ESL to expose the first sidewall and the upper surface of the first dielectric layer; and
   filling the opening with a second electrically conductive material to form a via.

18. The method of claim 17, wherein the protection layer is formed of a hydrophobic material.

19. The method of claim 17, further comprising, after forming the conductive line and before forming the ESL:
   selectively depositing a third dielectric layer on the upper surface of the first dielectric layer, wherein the third dielectric layer covers the upper surface of the first dielectric layer and exposes the upper surface of the conductive line, wherein the ESL is formed over the conductive line and the third dielectric layer.

20. The method of claim 19, wherein selectively depositing the third dielectric layer comprises performing a deposition process using a first precursor comprising silicon and a second precursor comprising oxygen.

* * * * *